(12) United States Patent
Chandra et al.

(10) Patent No.: US 10,291,246 B2
(45) Date of Patent: May 14, 2019

(54) DIGITAL-TO-ANALOG CONVERTER (DAC) WITH DIGITAL OFFSETS

(71) Applicant: MaxLinear, Inc., Carlsbad, CA (US)

(72) Inventors: Gaurav Chandra, Carlsbad, CA (US); Tao Zeng, Carlsbad, CA (US); Shantha Murthy Prem Swaroop, Carlsbad, CA (US); Jianyu Zhu, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/633,157

(22) Filed: Jun. 26, 2017

(65) Prior Publication Data

US 2017/0359080 A1    Dec. 14, 2017

Related U.S. Application Data

(63) Continuation of application No. 15/130,636, filed on Apr. 15, 2016, now Pat. No. 9,692,435.

(60) Provisional application No. 62/148,466, filed on Apr. 16, 2015.

(51) Int. Cl.
    *H03M 1/06*      (2006.01)
    *H03M 1/10*      (2006.01)
    *H03M 1/68*      (2006.01)

(52) U.S. Cl.
    CPC ....... *H03M 1/1023* (2013.01); *H03M 1/0607* (2013.01); *H03M 1/68* (2013.01)

(58) Field of Classification Search
    None
    See application file for complete search history.

(56) References Cited

U.S. PATENT DOCUMENTS

| 4,490,714 | A | 12/1984 | van de Plassche et al. |
| 4,857,927 | A * | 8/1989 | Takabayashi ....... H03M 1/0639 341/131 |
| 6,597,300 | B2 | 7/2003 | Mori |
| 6,642,869 | B2 | 11/2003 | Kuyel et al. |
| 7,068,193 | B2 * | 6/2006 | Dempsey ............ H03M 1/1028 341/120 |
| 7,378,998 | B2 | 5/2008 | Rudberg et al. |
| 2006/0007029 | A1 | 1/2006 | Ito |

OTHER PUBLICATIONS

Analog Devices AD1862 Datasheet Ultralow Noise Audio DAC circa Aug. 1997.*

* cited by examiner

*Primary Examiner* — Howard Williams
(74) *Attorney, Agent, or Firm* — McAndrews, Held & Malloy, Ltd.

(57) ABSTRACT

Systems and methods are provided for digital-to-analog conversions with adaptive digital offsets. A digital offset may be determined and applied to a digital input to a digital-to-analog converter (DAC), and digital-to-analog conversions are then applied via the DAC to the digital input with the digital offset. The digital offset may be set to account for one or more conditions relating to inputs to the DAC, with the one or more conditions affecting switching characteristics of one or more of a plurality of conversion elements in the DAC. The digital offset may be determined dynamically and adaptively, such as based on the input and/or conditions relating to the input. The adjustments may be selectively applied to the digital offset for particular input conditions.

32 Claims, 7 Drawing Sheets

DIGITAL-TO-ANALOG CONVERTER (DAC) WITH DIGITAL OFFSETS

CLAIM OF PRIORITY AND CROSS-REFERENCE TO RELATED APPLICATIONS

This patent application is a continuation of U.S. patent application Ser. No. 15/130,636, filed on Apr. 15, 2016, which in turn makes reference to, claims priority to and claims benefit from each of U.S. Provisional Patent Application Ser. No. 62/148,466, filed Apr. 16, 2015.

This patent application also makes reference to: U.S. patent application Ser. No. 15/130,602, filed on Apr. 15, 2016; and U.S. patent application Ser. No. 15/130,617, filed on Apr. 15, 2016.

Each of the above identified applications is hereby incorporated herein by reference in its entirety.

TECHNICAL FIELD

Aspects of the present disclosure relate to signal processing. More specifically, various implementations of the present disclosure relate to digital-to-analog converter (DAC) with digital offsets.

BACKGROUND

Conventional approaches for performing digital-to-analog conversions may be costly, cumbersome, or inefficient—e.g., they may be complex and/or time consuming, require considerable power, and/or may introduce errors or distortion. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for digital-to-analog converter (DAC) with digital offsets, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1:
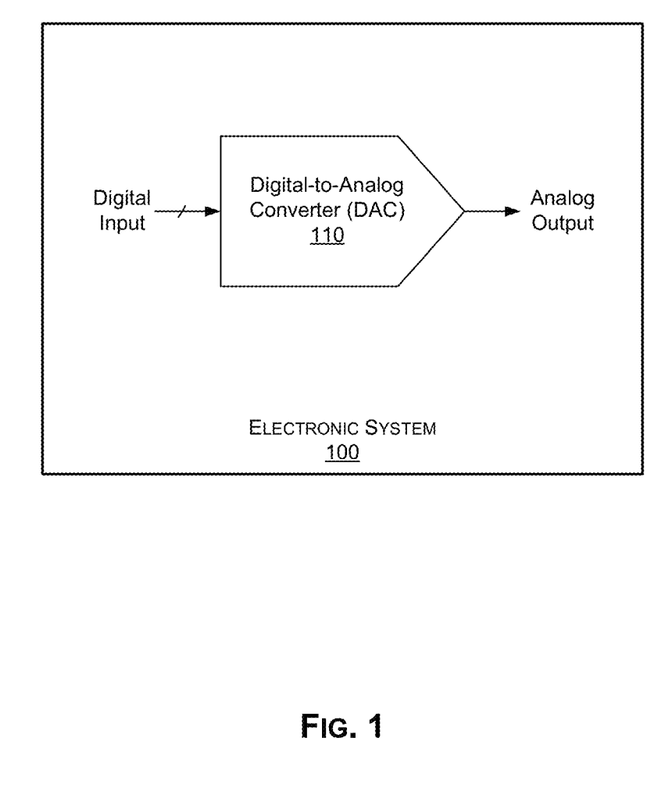
FIG. 1 illustrates an example electronic system that may be operable to perform digital-to-analog conversions.

FIG. 1 illustrates an example electronic system that may be operable to perform digital-to-analog conversions. Shown in FIG. 1 is an electronic system 100.

The electronic system 100 may comprise suitable circuitry for implementing various aspects of the present disclosure. The electronic system 100 may be configured to support performing, executing or running various operations, functions, applications and/or services. The electronic system 100 may be used, for example, in executing computer programs, playing video and/or audio content, gaming, performing communication applications or services (e.g., Internet access and/or browsing, email, text messaging, chatting and/or voice calling services), providing networking services (e.g., WiFi hotspot, Bluetooth piconet, Ethernet networking, cable or satellite systems, and/or active 4G/3G/femtocell data channels), or the like.

In some instances, the electronic system 100 may enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted and/or received signals in accordance with applicable wired or wireless protocols.

Examples of wireless standards, protocols, and/or interfaces that may be supported and/or used by the electronic system 100 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), and/or the like.

Examples of wired standards, protocols, and/or interfaces that may be supported and/or used by the electronic system 100 may comprise Ethernet (IEEE 802.3), Fiber Distributed Data Interface (FDDI), Integrated Services Digital Network (ISDN), cable television and/or internet access standards (e.g., ATSC, DVB-C, DOCSIS, etc.), in-home distribution standards such as Multimedia over Coax Alliance (MoCA), and Universal Serial Bus (USB) based interfaces.

Examples of signal processing operations that may be performed by the electronic system 100 may comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to support input/output (I/O) operations, to enable receiving input from and/or providing output to users. Accordingly, the electronic system 100 may comprise components or subsystems for obtaining user input and/or providing output to the user. For example, the electronic system 100 may support input/output (I/O) operations for allowing user interactions which may be needed for controlling the electronic system 100 or operations thereof—e.g., allowing users to provide input or commands, for controlling certain functions or components of the electronic system 100, and/or to output or provide feedback pertaining to functions or components. The electronic system 100 may also support input/output (I/O) operations in conjunction with use of data (e.g., multimedia content). For example, the electronic system 100 may support generating, processing, and/or outputting of video and/or acoustic signals, such as via suitable output devices or components (e.g., displays, loudspeakers, etc.). In this regard, the output signals may be generated based on content, which may be in digital form (e.g., digitally formatted music or the like). Similarly, the electronic system 100 may support capturing and processing of video and/or acoustic signals, such as via suitable input devices or components (e.g., cameras, microphones, etc.), to generate (e.g., to store or communicate) corresponding data. The corresponding data may be in digital form (e.g., digitally formatted music, video, or the like).

The electronic system 100 may be a stationary system (e.g., being installed at, and/or configured for use only in particular location). In other instances, however, the electronic system 100 may be a mobile device—i.e. intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), computers (e.g., laptops, desktops, or servers), dedicated media devices (e.g., televisions, game consoles, or portable media players, etc.), set-top boxes (STBs) or other similar receiver systems, and the like. The disclosure, however, is not limited to any particular type of electronic system.

In operation, the electronic system 100 may be operable to perform various operations, functions, applications and/or services. For example, in some instances, electronic system 100 may be operable to communicate (send and/or receive) data, and to process the communicated data. In this regard, communication of data, whether over wired or wireless interfaces, may typically comprise transmitting and/or receiving signals that are communicated over wireless and/or wired connections. For example, analog radio frequency (RF) signals may be used to carry data (e.g., content), with the data being embedded into the analog signals in accordance with particular analog or digital modulation schemes. For analog communications, data is transferred using continuously varying analog signals, and for digital communications, the analog signals are used to transfer discrete messages in accordance with a particular digitalization scheme. Thus, handling of digital communications (e.g., in the electronic system 100) may typically require performing, among other things, digital-to-analog conversions on the transmitter-end and analog-to-digital conversions at the receiver-end.

Digital-to-analog conversions and/or analog-to-digital conversions may also be performed in the electronic system 100 during other (non-communicative) operations. For example, during audio/video related operations, audio/video content that is typically formatted in digital form may be processed to generate corresponding analog audio or video signals during output operations, and captured audio and/or video analog signals may be processed, to generate the digital audio/video content. That processing may comprise performing digital-to-analog conversions (e.g., during output operations), and/or analog-to-digital conversions (e.g., during input operations).

Accordingly, the electronic system 100 may incorporate suitable components for providing digital-to-analog conversions and/or analog-to-digital conversions. For example, the electronic system 100 may comprise one or more digital-to-analog converters (DACs) 110. Each DAC 110 may comprise suitable circuitry for performing digital-to-analog conversions. The DACs 110 may be utilized, e.g., during signal processing, such as to allow converting digital data into analog waveforms—e.g., corresponding to and/or being embedded into acoustic signals, radio frequency (RF) signals, etc. The disclosure, however, is not limited to any particular use scenario, and may be utilized in any appropriate setup performing or requiring digital-to-analog conversions.

Various architectures and/or designs may be used for digital-to-analog conversions and/or in implementing corresponding digital-to-analog converters (DACs). Example types of DACs include pulse-width modulation (PWM) DACs, binary-weighted DACs, oversampling or interpolating (e.g., delta-sigma) DACs, R-2R ladder DACs, successive-approximation (or cyclic) DACs, thermometer-coded DACs, etc. In each of these DAC architectures and/or designs, digital-to-analog conversions may be achieved by adjusting a particular parameter (e.g., voltage, current, etc.) based on input binary data, in a particular manner. For example, with current-steering DACs, the digital-to-analog conversion may be performed based on steering of current from various sources, with the steering being controlled or adjusted based on the input digital data (sequence of bits).

Various issues may arise with DACs and operations thereof, which may need to be accounted for and/or addressed to optimize performance or operation of the DACs. Some of these issues may be general (e.g., affecting and/or existing in all DACs), while other issues may be specific (e.g., limited to particular type(s) of DAC, to particular technique(s) for digital-to-analog conversion, to particular operation condition(s), etc.).

For example, a thermometer-coded DAC may comprise an equal resistor or current-source segment for each possible value of DAC output. Thus, an 8-bit thermometer-coded DAC may have, for example, 255 segments, and a 16-bit thermometer-coded DAC would have 65,535 segments. The thermometer-coded architecture may be the fastest (e.g., with conversion speed possibly exceeding 1 billion samples per second) and highest precision DAC architecture. However, the speed and precision of such DACs may come at the expense of high cost (due to number of component circuits) and power consumption.

Thus, in some instances, DACs may incorporate combined or hybrid implementation or architecture, whereby parts of the DAC may be configured for handling particular portions of the digital input code to be converted. For example, the DAC may be implemented using segmented architecture, comprising a segment for handling the most significant bits (MSBs) of the digital input (MSB segment), and one or more other segments for handling the remaining part(s) of the digital input (e.g., the least significant bits (LSBs) of the digital input). In a particular example implementation, the MSB segment may comprise unit-weighted elements and may be thermometer-coded. The number of bits handled in the MSB segment may vary. The one or more other segments may be implemented using less costly techniques or architectures (e.g., based on binary-coded toggling).

Additional issues may arise, however, with such implementations. For example, in some instances the DACs may not be operating at full scale—e.g., the signal may be backed off from full scale. In this regard, "full scale" represents the maximum signal amplitude a system can present (or handle), and as such signals may be described as "backed off" or operating at "backoff" condition when not reaching full scale. Thus, a high backoff means very small signal amplitude, comparatively smaller than full scale; a low backoff means signal amplitude close to full scale; and no backoff means a full scale signal—that is having amplitude at full scale. Backoff conditions may have effects on DACs, which may vary based on the architectures used and/or particular function incorporated therein. Such backing off may cause or contribute to, for example, potential errors, such as power burst related issues. In this regard, where signals are backed off from full scale, mismatch errors may be introduced.

Accordingly, in various implementations of the present disclosure, DAC may be configured to incorporate adaptive corrective measures to prevent, account for, and/or mitigate effects of backoff conditions. This may be done by, for example, configuring the DAC to apply offsets to the input data being configured, to modify the output in a manner that eliminate or at least mitigate the potential errors that may be introduced in such backoff conditions. An example of such corrective measures is described below, such as with respect to FIGS. 2A and 2B.

Further, in some instances DACs implemented in accordance with the present disclosure may incorporate additional features and/or functions for further enhancing operations of the DACs. For example, in some instances these DACs may support use of enhanced dynamic element matching (DEM) and/or calibration, as described in U.S. patent application Ser. No. 15/130,602, filed on Apr. 15, 2016, and entitled "DIGITAL-TO-ANALOG CONVERTER (DAC) WITH PARTIAL CONSTANT SWITCHING"; and/or use of enhanced dynamic element matching (DEM) and calibration techniques as described in U.S. patent application Ser. No. 15/130,617, filed on Apr. 15, 2016, and entitled "DIGITAL-TO-ANALOG CONVERTER (DAC) WITH ENHANCED DYNAMIC ELEMENT MATCHING (DEM) AND CALIBRATION".

Figure 2A:
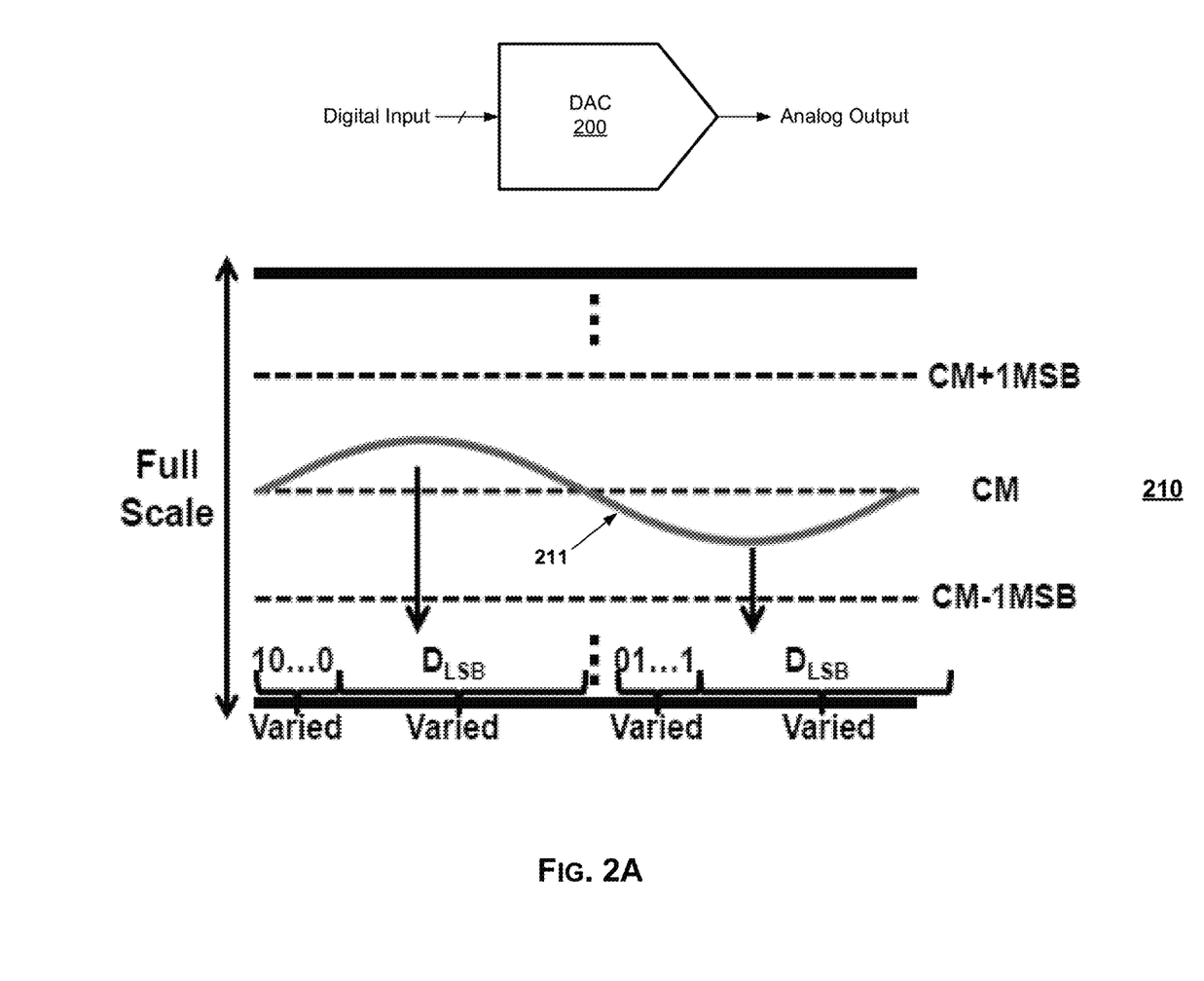
FIG. 2A illustrates a graph of an example signal backed off from full scale that is processed in a digital-to-analog convertor (DAC).

FIG. 2A illustrates a graph of an example signal backed off from full scale that is processed in a digital-to-analog convertor (DAC). Shown in FIG. 2A is a graph 210, depicting signal line 211, representing output signal of a digital-to-analog convertor (DAC) 200.

The DAC 200 may comprise suitable circuitry for performing digital-to-analog conversions (as such, the DAC 200 may correspond to DAC 110 of FIG. 1). For example, the DAC 200 may be implemented as a segmented DAC—e.g., with a most significant bit (MSB) segment, which may be thermometer-coded, for handling the most significant bits (MSBs), and one or more other segments for handling the least significant bits (LSBs).

In some instances, the signal may be backed off from full scale as shown in FIG. 2. This may result in particular errors or performance degradation in the output. For example, where the DAC 200 may comprise a MSB segment (e.g., array) which may be thermometer-coded, only a most significant bit (MSB) element may switch, because the signal has to cross the common mode (CM) level. All the least significant bits (LSBs) may toggle based on input codes. To eliminate large mismatch errors, the single MSB element must be matched with the sum of all the LSB elements very accurately. If not handled properly, differential nonlinearity (DNL) may occur in the DAC output.

Accordingly, in various implementations of the present disclosure, measures may be taken to eliminate or mitigate issues or errors arising in such scenarios. For example, in some implementations, digital offsets may be applied to the input signals, to account for (e.g., eliminate) switching of MSB elements, thus mitigating any issues arising from such switching. Examples of use of such digital offsets are described in more detail below.

Figure 2B:
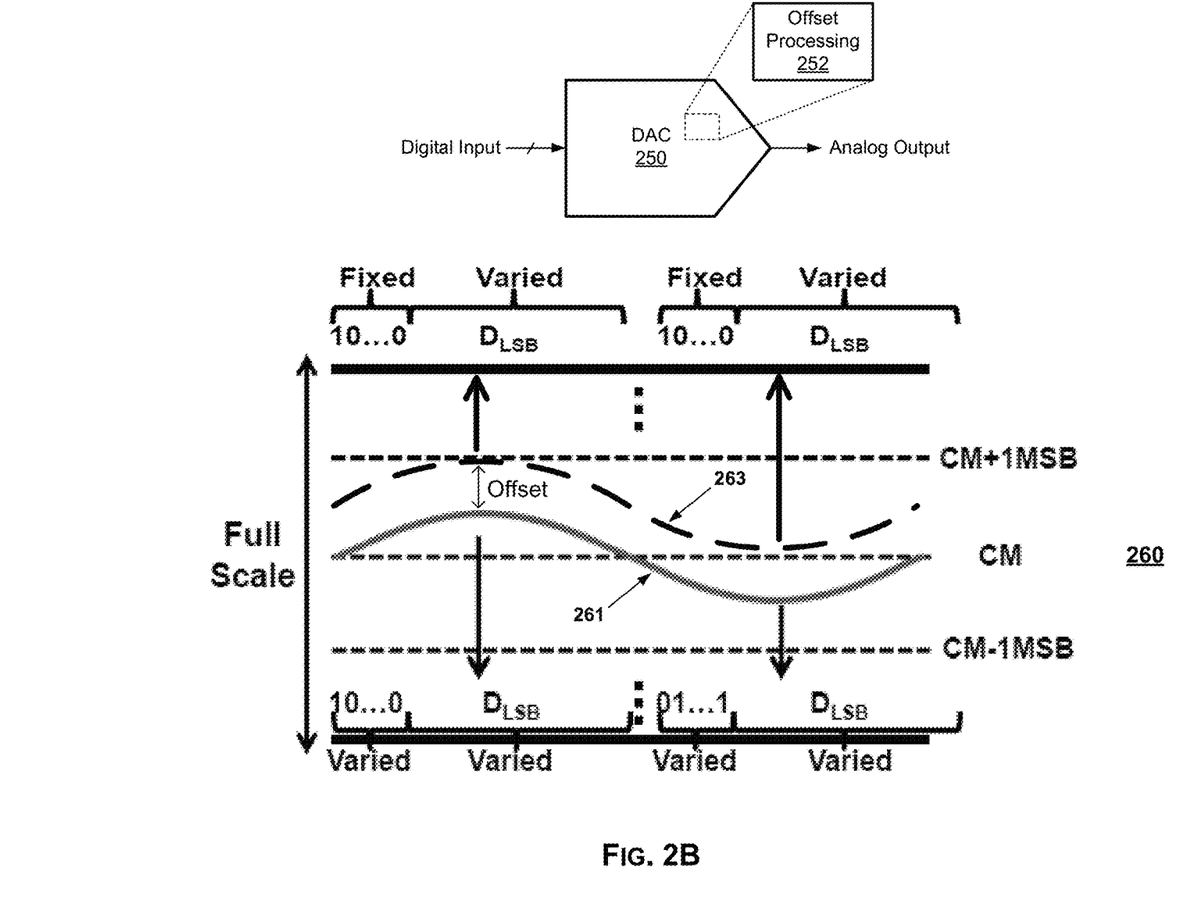
FIG. 2B illustrates a graph of an example signal backed off from full scale that is processed in a digital-to-analog convertor (DAC) that applies digital offsets.

FIG. 2B illustrates a graph of an example signal backed off from full scale that is processed in a digital-to-analog convertor (DAC) that applies digital offsets. Shown in FIG. 2B is a graph 260 representing output signal of a digital-to-analog convertor (DAC) 250, which applies digital offsets.

The DAC 250 may comprise suitable circuitry for performing digital-to-analog conversions, and for additionally applying digital offsets during such conversions. For example, the DAC 250 may comprise an offset processing circuit 252 for supporting application of digital offsets during digital-to-analog conversions, in accordance with the present disclosure. In this regard, the offset processing circuit may be operable to compute, store, and/or apply digital offsets, and/or handle post-processing relating to applications of such digital offsets, as described in more details below. Thus, the DAC 250 may represent an implementation of DAC 110 of FIG. 1 in accordance with the present disclosure.

In an example implementation, the DAC 250 may be implemented as a segmented DAC—e.g., comprising a most significant bit (MSB) segment, which may be thermometer-coded, for handling the most significant bits (MSBs), and one or more other segments for handling the remaining least significant bits (LSBs) bits (e.g., an upper LSBs (ULSBs) segment for handling ULSBs and a least significant bits (LSBs) segment for handling the remaining LSBs), but with additional circuitry for applying digital offset (e.g., in adaptive and/or dynamic manner).

Shown in graph 260 are signal lines 261 and 263. In this regard, the signal line 261 may represent an example output signal (e.g., of the DAC 250) when no adjustments (e.g., digital offsets) are made, whereas the signal line 263 represents the output signal of the DAC 250 with adjustments. In particular, the DAC 250 may be configurable to apply certain enhancement measures under certain conditions—e.g., adjustments to account for (or eliminate effects of) switching of MSB elements, thus mitigating any issues arising from such switching. For example, a digital offset may be added to the digital input, to ensure that the signal swing falls between two major MSB transitions (e.g., between CM and one of CM+1 MSB and CM−1 MSB) so that the MSB code may be fixed, thus eliminating the switching MSB element.

In some instances, digital offsets may be pre-determined, such as during design stage, based on the DAC (its architecture, characteristics, etc.). In other instances, the digital offset may be determined or calculated dynamically (e.g., by the offset processing circuit 252), such as based on various parameters and/or characteristics relating to the DAC 250 or its operations, and/or to the input signals being processed.

The digital offset may be determined in various ways. In an example implementation, the digital offset may be determined based on switching LSBs. For example, the number of switching LSBs may be first determined, such as using the following equation (Eq. 1):

$$N_{LSB\_SW} = \mathrm{ceil}(N_{DAC} - \log_2(10^{backoff/20})) \quad \text{Eq. 1}$$

where $N_{LSB\_SW}$ is the number of switching LSBs; $N_{DAC}$ is the resolution of the DAC; and backoff is the amount (in dBs) that the signal is backed off.

The digital offset may then be determined based on the number of switching LSBs—e.g., calculated as the middle level of the switching LSBs, which can be computed using the following equation (Eq. 2):

$$D_{offset} = 0.5 * 2^{N_{LSB\_SW}} \quad \text{Eq. 2}$$

where $D_{offset}$ is the digital offset to be applied.

In some instances, pre-determined digital offsets may be adjusted during application thereof, such as based on other parameters and/or characteristics associated with the DAC or operations thereof. For example, in instances where further segmentation may be applied in the LSB array, the offset value can be adjusted for optimal performance in some heavily backoff cases.

In some instances, where the digital offsets are pre-determined, the DAC may be configured to use the digital offset uniformly (e.g., during full scale and all backoff conditions). In other words, the DAC may be configured to apply the pre-set digital offset to all inputs. In other instances, digital offsets (including those are determined dynamically or are pre-determined) may be applied selectively and/or adaptively, such as based on particular use criteria relating to the DAC and/or the input signals being processed therein. For example, DACs supporting use of digital offsets may be configured such as to disable (or enable) use of digital offset under certain conditions. In this regard, as application of digital offsets may not improve performance in full scale conditions, the digital offset (and component(s) used in application thereof) may be disabled when the DAC is functioning in full scale mode. In an example implementation, the digital offsets may be applied selectively in backoff conditions—e.g., only when the signal backoff exceeds certain threshold.

In some instances, post-processing may be performed (e.g., to the DAC's output) to account for the addition of the digital offsets that had been applied. In an example implementation, an analog offset may be applied to the (analog) output of the DAC when a digital offset had been applied in the DAC. The analog offset may be determined or calculated such that it may match (or compensate for the effect—e.g., shift caused by) the applied digital offset. In yet another example embodiment, however, the post-processing may be selectively applied (e.g., applied or not, such as based on user input, pre-set criteria, etc.). The disclosure is not so limited, however, and in some instances no post-processing (e.g., addition of analog offsets) may be done.

In some instances, digital offsets may be computed for different input condition (e.g., backoff cases), and the design of DACs may be set and/or modified accordingly. For example, digital offsets required for different backoff cases may be computed, and the computed values may then be used in determining optimal segmentation for DACs for a given application. Further, the DACs may be configured such that the digital offset can be set (e.g., selected from the pre-determined values) dynamically based on input conditions.

In some instances, adjustments may be applied to digital offsets to optimize performance. The adjustments may be determined and/or used adaptively, such as only for given applications and/or input conditions. For example, where the DAC incorporate segmentation based design, with further segmentation being applied in the LSB array, adjustments may be applied to the digital offset for optimal performance in some heavily backoff cases. The digital offset may be applied first for MSB switching, then refined based on ULSB switching, by applied a determined offset (adjustment) for the ULSB switching. An example of such iterative offset determination and/or application is described below.

Figure 3:
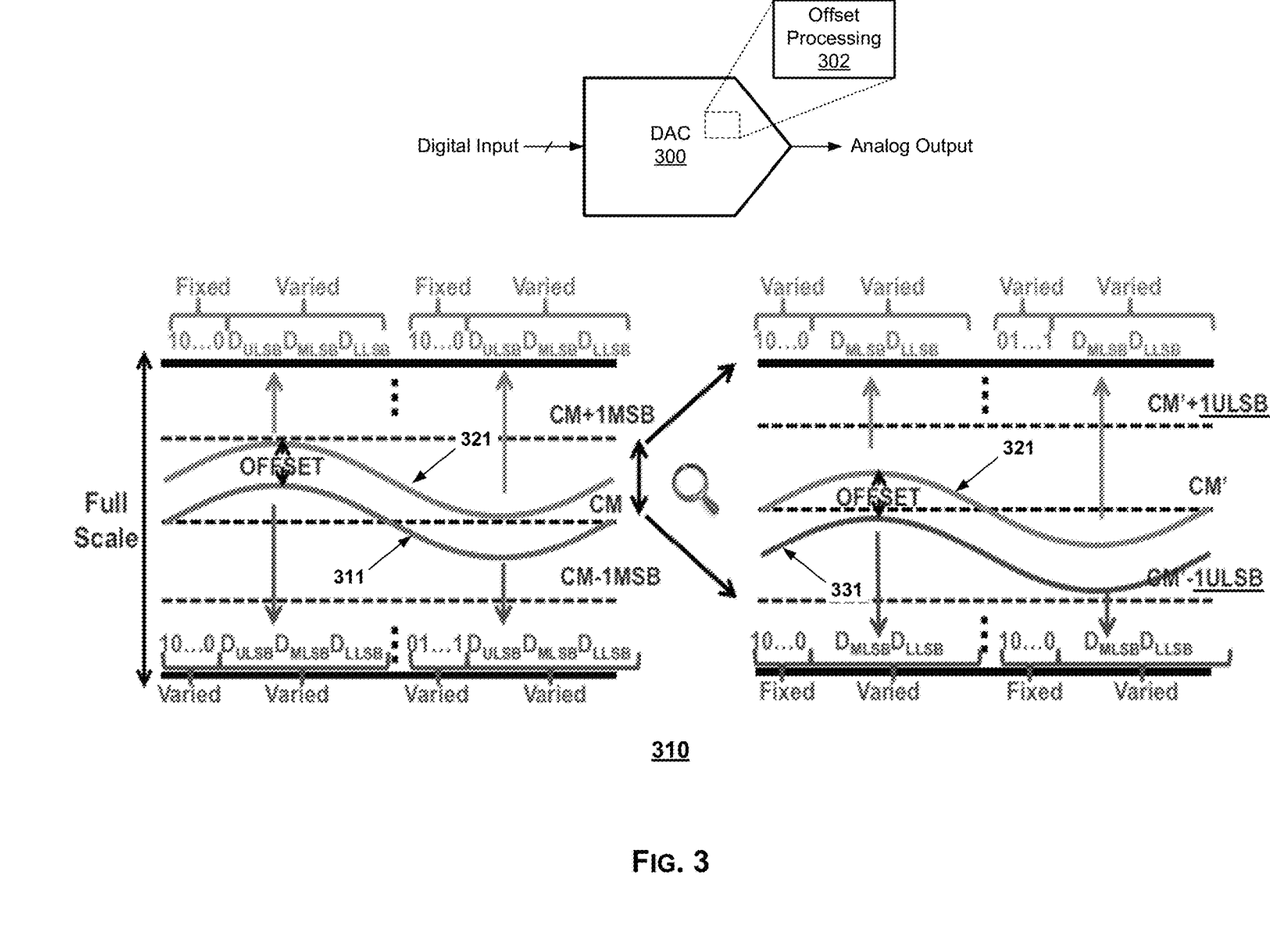
FIG. 3 illustrates a graph of an example signal backed off from full scale that is subjected to multiple adjustments during processing in a digital-to-analog convertor (DAC) that applies digital offsets.

FIG. 3 illustrates a graph of an example signal backed off from full scale that is subjected to multiple adjustments during processing in a digital-to-analog convertor (DAC) that applies digital offsets. Shown in FIG. 3 is a graph 310, representing output signal of a digital-to-analog convertor (DAC) 300, which applies digital offsets.

The DAC 300 may be substantially similar to the DAC 250 of FIG. 2B. In this regard, the DAC 300 may comprise suitable circuitry for performing digital-to-analog conversions, and for additionally supporting (e.g., via an offset processing circuit 302, which is similar to the circuit 252 noted above) application digital offsets during such conversions. Various aspects of the design of the DAC 300 and/or selection of parameters used therein (e.g., digital offsets) may be set and/or modified adaptively, such as to accommodate different input conditions, and/or to enable applying optimal adjustments (e.g., digital offsets) in such conditions.

In an example implementation, the DAC 300 may be implemented as a segmented DAC—e.g., comprising a most significant bit (MSB) segment, for handling the most significant bits (MSBs) in the input, and a least significant bit (LSB) array comprising one or more other LSB segments for handling the remaining least significant bits (LSBs) in the input. For example, beside the MSB segment, the DAC 300 may comprise a segment for handling upper LSBs (ULSBs), which comprise one or more LSBs that follow directly after the MSBs; a segment for handling middle LSBs (MLSBs), which comprise one or more LSBs that follow the ULSBs; and a segment for handling lower LSBs (LLSBs), which comprise the remaining LSBs following the MLSBs.

For example, the DAC 300 may be implemented as a 13-bit DAC. The segmentation of the DAC 300 (e.g., size of each segment, type of bit in each segment, etc.) may be determined such that enable handling particular input conditions. The DAC 300 may be adaptively configured to handle, for example, 28 dB, 32 dB and 45 dB backoffs from full scale. The number of the switching LSBs may be computed, using equation 1 (Eq. 1) described above, for each these input conditions, and the optimal design (e.g., segmentation strategy) may then be determined based on the computed values. The overall design may then be selected for optimizing performance for all of these input conditions. Further, the digital offset and/or any required adjustments thereto (e.g., to refine performance for certain input conditions) may be determined.

For example, for the 45 dB backoff case, using equation 1 (Eq. 1) the number of switching LSBs ($N_{LSB\_SW}$) is computed to be 6. This may be optimally handled using a segmentation of 3 thermometer bits and 3 binary bits to obtain best differential nonlinearity (DNL) performance based on design experience. For the 32 dB backoff case, $N_{LSB\_SW}$ is computed to be 8. This may be optimally handled using a segmentation of 2 thermometer bits, 3 thermometer bits, and 3 binary bits, to also accommodate the 45 dB backoff case. For the 28 dB backoff case, $N_{LSB\_SW}$ is computed to be 9. This may be optimally handled using a segmentation of 3 thermometer bits, 3 thermometer bits, and 3 binary bits, to also accommodate both of the 32 dB and 45 dB backoff cases.

Accordingly, the optimal design for the DAC 300 may be determined to be a 4-3-3-3 segmentation, with 4 thermometer bits MSB segment for handling 4 most significant bits (MSBs) in the input; 3 thermometer bits ULSB segment for handling 3 upper least significant bits (ULSBs) in the input, following the 4 MSBs; 3 thermometer bits MLSB segment for handling 3 middle least significant bits (MLSBs) in the input, following the 3 ULSBs; and a 3 binary bits LLSB segment for handling the 3 remaining lower least significant bits (LLSBs) in the input, following the MLSBs.

The digital offset may then be determined based on the chosen DAC design (13-bit resolution, with 4-3-3-3 segmentation), and may be used thereafter for all backoff values. For example, to eliminate MSB switching for all cases, the lowest backoff number (28 dB backoff) may be used for the digital offset calculation based on equation 2 (Eq. 2) described above, which would result in $D_{offset}$ of 256. Further, as further segmentation is applied in the LSB array, the digital offset value may be adjusted for optimal performance, such as in some heavily backoff cases (e.g. 45 dB backoff case). In this regard, in the 45 dB case another segment MLSB is introduced between ULSB and LLSB, causing one ULSB element switching in the 45 dB backoff case with $D_{offset}$=256. Using equation 2 (Eq. 2), it may be determined that for the 45 dB backoff case a $D_{offset}$=32 is needed. Thus, a further adjustment may be made, by adding (or subtracting) that offset, 32, to accommodate the 45 dB backoff case. This is illustrated in graph 310, wherein the original input signal 311 is first subject to initial (overall) offset adjustment (e.g., applying digital offset of 256) resulting in adjusted signal 321, which is then subject a refinement, using an offset adjustment (e.g., subtraction of a digital offset of 32) to accommodate the 45 dB backoff case, resulting in adjusted signal 331. Thus, as described the DAC 300 may be configured to apply an overall digital offset of 224 (256 −32).

Figure 4:
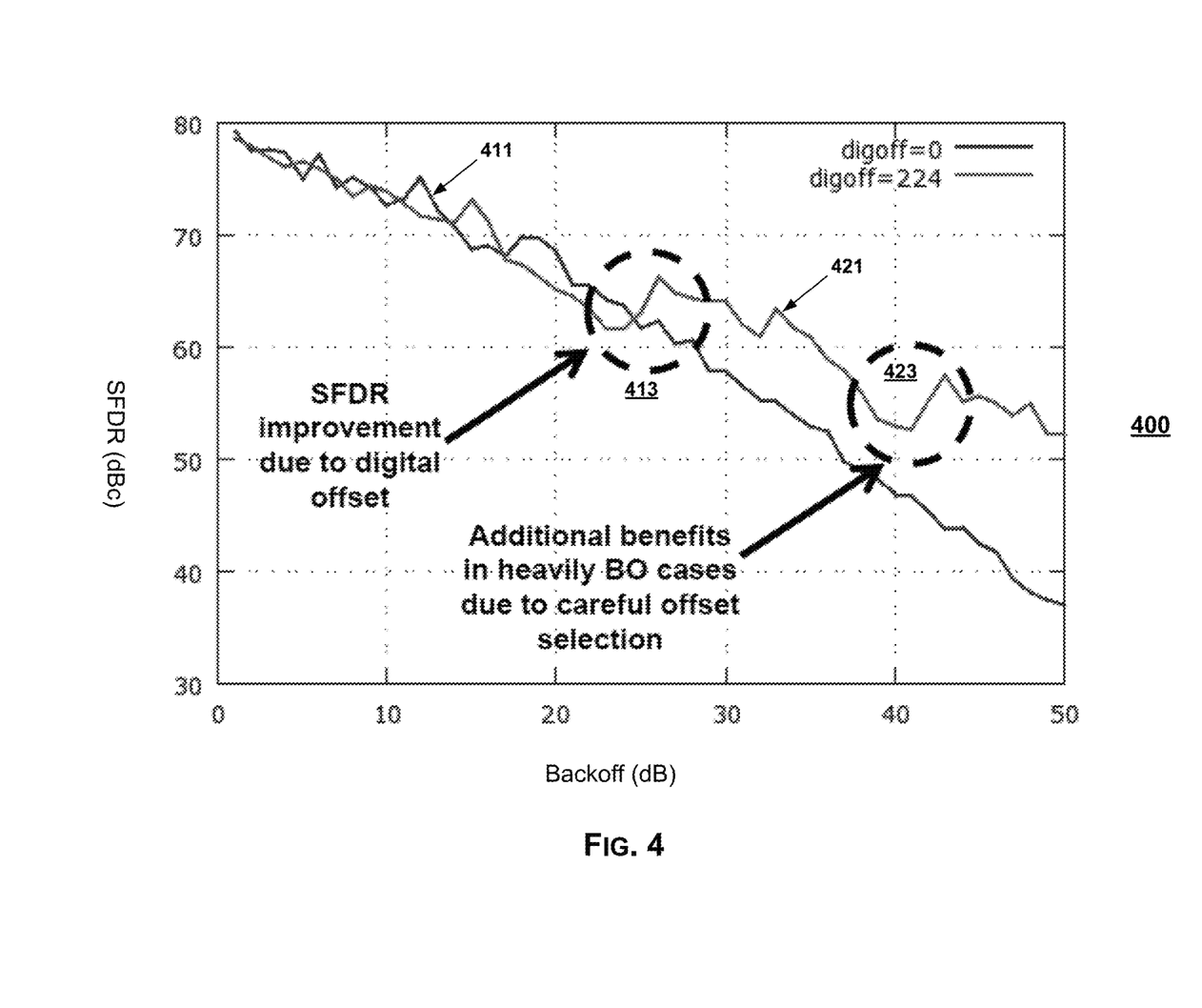
FIG. 4 illustrates a graph depicting example change in performance with application of digital offsets during processing of an example signal in a digital-to-analog convertor (DAC).

The improvement that may be achieved by the use of such configuration (design and digital offset) for such DAC is shown with respect to FIG. 4.

FIG. 4 illustrates a graph depicting example change in performance with application of digital offsets during processing of an example signal in a digital-to-analog convertor (DAC).

FIG. 4 illustrates a graph depicting example change in performance with application of digital offsets during processing of an example signal in a digital-to-analog convertor (DAC). Shown in FIG. 4 is graph 400.

The graph 400 depicts spurious-free dynamic range (SFDR), which is one of the performance measurements typically used in conjunction with DACs and their operations (measured in dBc), for a particular DAC in relation to (as a function of) the backing off (measured in dB) applied in the DAC. In this regard, the DAC may be operable to selectively and adaptively apply digital offsets and/or refinements thereto, as described with respect to FIG. 3.

For example, the graph 400 as shown in FIG. 4 may correspond to example use scenario of a DAC similar to the DAC 300 of FIG. 3—that is a 13-bit DAC with 4-3-3-3 segmentation. The graph 400 includes signal lines 411 and 421, corresponding to the SFDR-vs-backoff profile of the DAC without and with application of a particular digital offset—e.g., an overall offset of 224, using the example parameters/characteristics of the DAC 300 as described above. In this regard, as noted above, the digital offset is applied (at point 413) for the MSB switching, and secondary adjustment (refinement) as subsequently applied (at point 423) for heavily backoff conditions (e.g., 45 dB backoff). As shown in graph 400 of FIG. 4, improvement in SFDR becomes notable with increased backoff (e.g., around 20-25 dB); with additional improvement in heavily backed off cases (e.g., over 40 dB), due to careful offset selection (or adjustment thereto).

Figure 5:
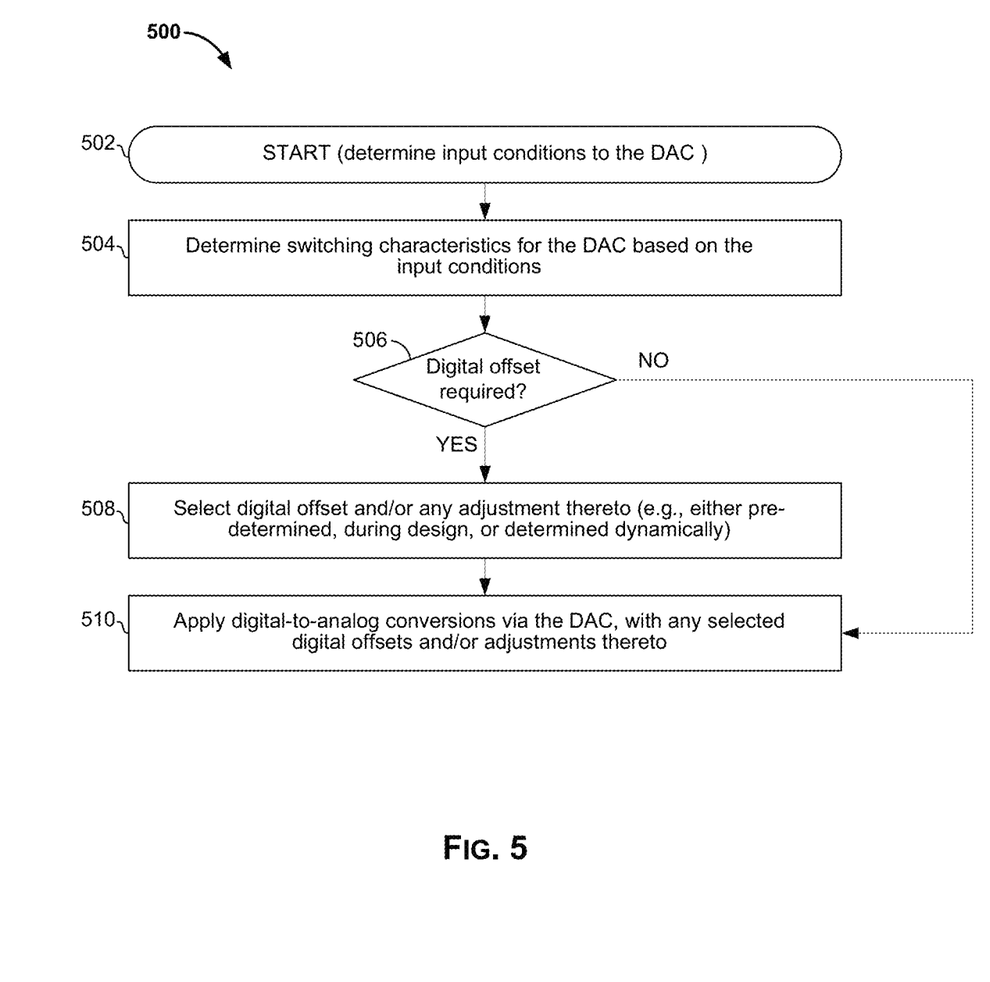
FIG. 5 illustrates a flowchart of an example process for applying digital-to-analog conversion with use of digital offsets.

FIG. 5 illustrates a flowchart of an example process for applying digital-to-analog conversion with use of digital offsets. Shown in FIG. 5 is flow chart 500, comprising a plurality of example steps (represented as blocks 502-510), which may be performed in a suitable system (e.g., DAC 250 of FIG. 2B, or DAC 300 of FIG. 3) to apply digital-to-analog conversions with use of digital offsets.

In start step 502, input conditions to the DAC may be determined (e.g., determine what the input code is, whether it includes particular sequences of 0s or 1s, etc.).

In step 504, switching characteristics for the DAC, based on the input conditions, may be determined. For example, it may be determined the switching in various elements in the DAC (e.g., MSB elements). This may enable determining whether based on the input condition DAC signal may be at full scale, or is backed off (and if so, the level of backing off).

In step 506, it may be determined whether digital offset is required. For example, it may be determined whether based on the input condition there may be need for the applying the offset, such as in backoff cases (and/or where backoff exceed particular threshold). In instances where no digital offset is required or possible, the process may proceed directly to step 510; otherwise, the process proceeds to step 508. In some implementations, this step may be forgone, and digital offsets may be applied for all input conditions.

In step 508, the digital offset and/or any adjustment thereto may be selected. In this regard, the digital offset and/or adjustment thereto may be pre-determined, such as during design/fabrication of the DAC, or it may be determined dynamically and/or adaptively during operations of the DAC and/or based on the particular input conditions.

In step 510, the DAC may apply digital-to-analog conversion to the input code, with digital offset and/or adjustment (if any are selected and/or determined).

Figure 6:
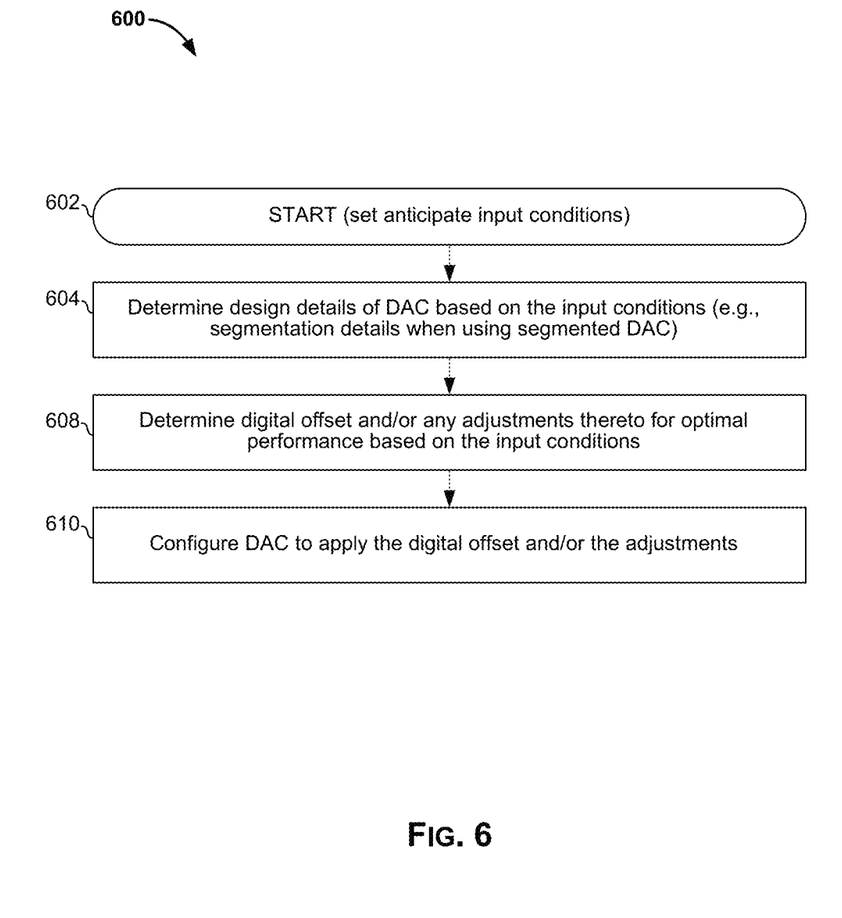
FIG. 6 illustrates a flowchart of an example process for configuring digital-to-analog convertors (DACs) to apply digital-to-analog conversion with use of digital offsets.

FIG. 6 illustrates a flowchart of an example process for configuring digital-to-analog convertors (DACs) to apply digital-to-analog conversion with use of digital offsets. Shown in FIG. 6 is flow chart 600, comprising a plurality of example steps (represented as blocks 602-608), which may be performed to configure digital-to-analog convertor (e.g., DAC 300 of FIG. 3) to apply digital-to-analog conversions with use of digital offsets In start step 602, input conditions to the DAC may be selected (e.g., various backoff conditions that the DAC is to accommodate).

In step 604, design details of DAC may be determined based on the input conditions. For example, where the DAC incorporate segmentation-based design, details relating to the segments (such as number of bits in each segments, type of bits, etc.) may be determined. This may be done for each of the anticipate input conditions, and then an overall design may be selected, as described with respect to FIG. 3 for example.

In step 606, the digital offset and/or any adjustment thereto may be determined based on the design. This may comprise determining a digital offset based on the overall design and adjustment that may applicable, such as in particular input conditions.

In step 608, the DAC may configured to apply the digital offset and/or adjustments (e.g., being programed with these values and/or data to control their application).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed:

1. A method, comprising:
   determining a digital offset for application to a digital input to a digital-to-analog converter (DAC) that comprises a plurality of conversion elements, wherein each conversion element handles a particular bit in digital inputs to said DAC, said determining comprising:
     determining when one or more conditions relating to digital inputs to said DAC are present, wherein said one or more conditions comprise signal backoff;
     determining one or more effects of said one or more conditions on switching characteristics of one or more of said plurality of conversion elements; and
     setting a value of said digital offset based on said determined one or more effects of said one or more conditions;
   applying said digital offset to said digital input; and
   applying, via said DAC, digital-to-analog conversion to said digital input with said digital offset.

2. The method of claim 1, comprising selectively applying one or more adjustments to said digital offset for one or more particular digital input conditions.

3. The method of claim 1, comprising dynamically determining said digital offset during handling of said digital input.

4. The method of claim 1, comprising adaptively determining said digital offset based on said digital input and/or one or more conditions relating to said digital input.

5. The method of claim 1, comprising determining said digital offset to modify one or more switching characteristics for at least one conversion element.

6. The method of claim 5, wherein said modifying said one or more switching characteristics comprises eliminating one or more switching transitions for at least one conversion element.

7. The method of claim 1, wherein switching characteristics comprise, for each conversion element, whether said conversion element switches or not for a particular digital input and/or one or more conditions related to said particular digital input.

8. A system comprising:
   a processing circuit; and
   a digital-to-analog converter (DAC) circuit configured for applying digital-to-analog conversions, said DAC circuit comprising a plurality of conversion elements with each conversion element configured to handle a particular bit in a digital input to said DAC circuit;
   wherein:

said processing circuit is operable to determine a digital offset, for application to said digital input, wherein said processing circuit:
  determines when one or more conditions relating to digital inputs to said DAC circuit are present, wherein said one or more conditions comprise signal backoff;
  determines one or more effects of said one or more conditions on switching characteristics of one or more of said plurality of conversion elements; and
  sets a value of said digital offset based on said determined one or more effects of one or more conditions; and
said DAC circuit is operable to:
  apply said digital offset to a digital input to said DAC circuit; and
  apply digital-to-analog conversion to said digital input with said digital offset.

9. The system of claim 8, wherein said DAC circuit is operable to selectively apply one or more adjustments to said digital offset for one or more particular digital input conditions.

10. The system of claim 8, wherein said processing circuit is operable to dynamically determine said digital offset during handling of said digital input.

11. The system of claim 8, wherein said processing circuit is operable to adaptively determine said digital offset based on said digital input and/or one or more conditions relating to said digital input.

12. The system of claim 8, wherein said processing circuit is operable to determine said digital offset to modify one or more switching characteristics for at least one conversion element.

13. The system of claim 12, wherein said modifying of said one or more switching characteristics comprises eliminating one or more switching transitions for at least one conversion element.

14. The system of claim 8, wherein switching characteristics comprise, for each conversion element, whether said conversion element switches or not for a particular digital input and/or one or more conditions related to said particular digital input.

15. The system of claim 8, wherein said DAC circuit comprises a segmentation-based implementation, comprising a plurality of segments, with each segment comprising one or more conversion elements of said plurality of conversion elements.

16. The system of claim 15, wherein said plurality of segments comprises:
  a most significant bits (MSBs) segment; and
  one or more least significant bits (LSBs) segments.

17. The system of claim 16, wherein said plurality of segments comprises:
  a lower least significant bits (LLSBs) segment;
  a middle least significant bits (MLSBs) segment; and
  an upper least significant bits (ULSBs) segment.

18. The system of claim 16, wherein digital offset is determined based on one or more switching characteristics of only one or a portion of conversion elements in said MSBs segment.

19. A method, comprising:
  determining a digital offset for application to a digital input to a digital-to-analog converter (DAC) that comprises a plurality of conversion elements, wherein each conversion element handles a particular bit in digital inputs to said DAC, said determining comprising:
    determining said digital offset to modify one or more switching characteristics for at least one conversion element, wherein said modifying of said one or more switching characteristics comprises eliminating one or more switching transitions for said at least one conversion element;
    determining when one or more conditions relating to digital inputs to said DAC are present;
    determining one or more effects of said one or more conditions on switching characteristics of one or more of said plurality of conversion elements; and
    setting a value of said digital offset based on said determined one or more effects of said one or more conditions; and
  applying said digital offset to said digital input; and
  applying, via said DAC, digital-to-analog conversion to said digital input with said digital offset.

20. The method of claim 19, comprising selectively applying one or more adjustments to said digital offset for one or more particular digital input conditions.

21. The method of claim 19, comprising dynamically determining said digital offset during handling of said digital input.

22. The method of claim 19, comprising adaptively determining said digital offset based on said digital input and/or one or more conditions relating to said digital input.

23. The method of claim 19, wherein switching characteristics comprise, for each conversion element, whether said conversion element switches or not for a particular digital input and/or one or more conditions related to said particular digital input.

24. A system comprising:
  a processing circuit; and
  a digital-to-analog converter (DAC) circuit configured for applying digital-to-analog conversions, said DAC circuit comprising a plurality of conversion elements with each conversion element configured to handle a particular bit in a digital input to said DAC circuit;
  wherein:
    said processing circuit is operable to determine a digital offset, for application to said digital input, wherein said processing circuit:
      determines said digital offset to modify one or more switching characteristics for at least one conversion element, wherein said modifying of said one or more switching characteristics comprises eliminating one or more switching transitions for at least one conversion element;
      determines when one or more conditions relating to digital inputs to said DAC circuit are present;
      determines one or more effects of said one or more conditions on switching characteristics of one or more of said plurality of conversion elements; and
      sets a value of said digital offset based on said determined one or more effects of one or more conditions; and
    said DAC circuit is operable to:
      apply said digital offset to a digital input to said DAC circuit; and
      apply digital-to-analog conversion to said digital input with said digital offset.

25. The system of claim 24, wherein said DAC circuit is operable to selectively apply one or more adjustments to said digital offset for one or more particular digital input conditions.

26. The system of claim 24, wherein said processing circuit is operable to dynamically determine said digital offset during handling of said digital input.

27. The system of claim 24, wherein said processing circuit is operable to adaptively determine said digital offset based on said digital input and/or one or more conditions relating to said digital input.

28. The system of claim 24, wherein switching characteristics comprise, for each conversion element, whether said conversion element switches or not for a particular digital input and/or one or more conditions related to said particular digital input.

29. The system of claim 24, wherein said DAC circuit comprises a segmentation-based implementation, comprising a plurality of segments, with each segment comprising one or more conversion elements of said plurality of conversion elements.

30. The system of claim 29, wherein said plurality of segments comprises:
   a most significant bits (MSBs) segment; and
   one or more least significant bits (LSBs) segments.

31. The system of claim 30, wherein said plurality of segments comprises:
   a lower least significant bits (LLSBs) segment;
   a middle least significant bits (MLSBs) segment; and
   an upper least significant bits (ULSBs) segment.

32. The system of claim 30, wherein digital offset is determined based on one or more switching characteristics of only one or a portion of conversion elements in said MSBs segment.

* * * * *